(12) United States Patent
Crippa

(10) Patent No.: US 11,131,690 B2
(45) Date of Patent: Sep. 28, 2021

(54) CONTACT PROBE FOR TESTING HEAD

(71) Applicant: Technoprobe S.p.A., Cernusco Lombardone (IT)

(72) Inventor: Giuseppe Crippa, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 15/640,097

(22) Filed: Jun. 30, 2017

(65) Prior Publication Data

US 2017/0307657 A1 Oct. 26, 2017

Related U.S. Application Data

(63) Continuation-in-part of application No. PCT/EP2015/079544, filed on Dec. 14, 2015.

(30) Foreign Application Priority Data

Dec. 30, 2014 (IT) .......................... MI2014A002286

(51) Int. Cl.
*G01R 1/067* (2006.01)
*G01R 3/00* (2006.01)
*H01R 13/03* (2006.01)
*H01R 13/24* (2006.01)

(52) U.S. Cl.
CPC ..... *G01R 1/06761* (2013.01); *G01R 1/06716* (2013.01); *G01R 1/06738* (2013.01); *G01R 3/00* (2013.01); *H01R 13/03* (2013.01); *H01R 13/2464* (2013.01)

(58) Field of Classification Search
CPC .............. H01R 13/03; H01R 13/2464; H01R 13/2471; H01R 2201/20; G01R 1/06755; G01R 1/06761; G01R 1/0675; G01R 1/06716; G01R 1/06738; G01R 3/00
See application file for complete search history.

(56) References Cited

U.S. PATENT DOCUMENTS

| | | | | |
|---|---|---|---|---|
| 6,573,738 B1 * | 6/2003 | Matsuo | ............... | G01R 1/07342 324/755.01 |
| 2002/0089344 A1 * | 7/2002 | Beaman | ............... | G01R 1/0675 324/755.01 |
| 2002/0127812 A1 * | 9/2002 | Matsunaga | ........ | G01R 1/06761 438/303 |

(Continued)

FOREIGN PATENT DOCUMENTS

| | | | | |
|---|---|---|---|---|
| EP | 2 060 921 A1 | 5/2009 | | |
| EP | 2060921 A1 * | 5/2009 | ......... | G01R 1/06755 |
| WO | 00/79293 A1 | 12/2000 | | |

*Primary Examiner* — Son T Le
*Assistant Examiner* — Dustin R Dickinson
(74) *Attorney, Agent, or Firm* — Seed IP Law Group LLP

(57) ABSTRACT

It is described a contact probe for a testing head of an apparatus for testing electronic devices including a body essentially extended along a longitudinal direction between a contact tip and a contact head, that contact probe comprising at least one multilayer structure, in turn including a superposition of at least one inner layer or core and a first inner coating layer, and an outer coating layer that completely covers the multilayer structure and made of a material having a higher hardness than a material realizing the core.

29 Claims, 5 Drawing Sheets

(56) References Cited

U.S. PATENT DOCUMENTS

| | | | |
|---|---|---|---|
| 2004/0239355 A1* | 12/2004 | Kazama | C23C 28/023 324/755.05 |
| 2005/0227510 A1* | 10/2005 | Brown | G01R 1/0466 439/66 |
| 2007/0200576 A1* | 8/2007 | Laurent | G01R 1/06733 324/755.07 |
| 2008/0074128 A1* | 3/2008 | Hirakawa | G01R 1/06755 324/755.01 |
| 2008/0143366 A1 | 6/2008 | Kurotori et al. | |
| 2009/0243637 A1* | 10/2009 | Okai | G01R 1/06761 324/724 |
| 2013/0099813 A1 | 4/2013 | Hoshino et al. | |
| 2015/0280345 A1* | 10/2015 | Kimura | H01R 13/2428 439/700 |

* cited by examiner

CONTACT PROBE FOR TESTING HEAD

BACKGROUND

Technical Field

The present disclosure refers to a contact probe for a testing head.

The disclosure refers particularly but not exclusively to a contact probe for a testing head of an apparatus for testing electronic devices integrated on wafer and the following description is made referring to this application field with the only purpose to simplify the exposition.

Description of the Related Art

As it is well known, a testing head (or probe head) essentially is a device apt to place a plurality of contact pads of a microstructure, in particular an electronic device integrated on wafer, into electrical contact with corresponding channels of a testing machine performing the functional test thereof, namely the electrical one, or generically the test.

The test performed on integrated devices allows to detect and isolate defective devices yet in the manufacturing step. Therefore, the testing heads usually are used for electrically testing the devices integrated on wafer before cutting and assembling them inside a chip-containing package.

A testing head usually includes a large number of contact elements or contact probes made of special alloy wires having good mechanical and electrical properties and provided with at least one contact portion for a corresponding plurality of contact pads of a device under test.

A testing head comprising vertical probes, which is usually called "vertical probe head", essentially includes a plurality of contact probes held by at least one pair of plates or guides, which are substantially plate-shaped and parallel to each other. Those guides are provided with specific holes and are arranged at a certain distance from each other so as to leave a free area or air gap for the movement and possible deformation of the contact probes. The pair of guides particularly includes an upper guide and a lower guide, both provided with respective guide holes where the contact probes axially slide, the probes being usually made of special alloy wires having good electrical and mechanical properties.

The good connection between contact probes and contact pads of the device under test is guaranteed by pressing the testing head on the device itself, the contact probes, which are movable inside the guide holes made in the upper and lower guides, undergoing a bending inside the air gap between the two guides and a sliding inside those guide holes during that pressing contact.

Moreover, the contact probe bending in the air gap can be assisted by a suitable configuration of the probes themselves or of their guides, as schematically shown in FIG. 1, where, for sake of illustration simplicity, only one contact probe of the plurality of probes usually included in a testing head has been depicted, the shown testing head being of the so-called shifted plates type.

In particular, in FIG. 1 a testing head 1 is schematically shown comprising at least one upper plate or guide 2 and one lower plate or guide 3, having respective upper guide hole 2A and lower guide hole 3A where at least one contact probe 4 slides.

The contact probe 4 has at least one contact end or tip 4A. Here and in the following, with the terms end or tip it is meant an end portion, not necessarily being sharp. In particular, the contact tip 4A abuts on a contact pad 5A of a device under test 5, realizing the electrical and mechanical contact between that device and a testing apparatus (not shown), such a testing head forming a terminal element thereof.

In some cases, the contact probes are fixedly fastened to the head itself at the upper guide: in such a case, the testing heads are referred to as blocked-probe testing heads.

Alternatively, testing heads are used having probes not fixedly fastened, but being interfaced to a board by means of a micro contact board: those testing heads are referred to as non-blocked probe testing heads. The micro contact board is usually called "space transformer" because, besides contacting the probes, it also allows spatially redistributing the contact pads made on it with respect to the contact pads of the device under test, particularly relaxing the distance constraints between the centers of the pads themselves.

In this case, as shown in FIG. 1, the contact probe 4 has a further contact tip 4B, usually specified as contact head, towards a plurality of contact pads 6A of that space transformer 6. The good electrical contact between probes and space transformer is guaranteed similarly to the contact with the device under test by pressing the contact heads 4B of the contact probes 4 against the contact pads 6A of the space transformer 6.

As already explained, the upper 2 and lower 3 guides are suitably separated by an air gap 7 allowing the deformation of the contact probes 4 and guaranteeing that contact tip and contact head of the contact probes 4 are contacting the contact pads of the device under test 5 and space transformer 6, respectively. Clearly, the upper 2A and lower 3A guide holes must be sized in order to allow the contact probe 4 sliding therein.

In fact, it should be remembered that the proper operation of a testing head is essentially tied to two parameters: the vertical movement, or overtravel, of the contact probes and the horizontal movement, or scrub, of the contact tips of those probes.

Therefore, these characteristics are to be evaluated and calibrated in the testing head manufacturing step, since the good electrical connection between probes and device under test must always be guaranteed.

It is also possible to realize a testing head having contact probes protruding from a support, usually made of a ceramic material, those probes possibly being suitably pre-deformed so as to guarantee a coherent bending thereof when contacting the pads of a device under test. Moreover, those probes bend further when contacting the pads of the device under test.

However, the packing density increase of the probes causes contact problems between the probes themselves, in particular when they are deformed during the testing head operation.

In order to guarantee a proper orientation of the probes, and particularly of their deformed sections, it is known to realize contact probes having non-circular section, particularly rectangular, and testing heads with guides having respective guide holes having in turn a non-circular section, particularly rectangular, which hold in position the contact probes during the contact thereof with the contact pads of the device under test and their consequent further deformation.

It is also known to realize the contact probes by means of multilayer structures, able to optimize the different characteristics essential to their good operation, in particular their mechanical strength and electrical conductivity, besides the possibility to be elastically deformed, in order to guarantee the proper contact with the contact pads of device under test and space transformer.

More particularly, those multilayer probes are usually made starting from multilayer metal sheets wherein the contact probes are conveniently cut out, particularly by means of laser-cutting.

Multilayer probes made according to the prior art include a central layer or core coated with one or more layers apt to improve the electrical and hardness performances of the overall probe.

For example, as shown in the section view A-A of FIG. 2A, taken at a plane α shown in FIG. 1, a multilayer probe 20 includes a core 21, for example made of tungsten W.

Suitably, the core 21 is covered by a first layer 22, in particular a high conductivity layer, for example made of gold Au, and a second layer 23, in particular a high hardness layer, for example made of rhodium Rd, those first and second layer being arranged on opposite sides of the core 21.

In particular, the multilayer probe 20 includes a first portion 22A of the first layer 22 at a first side 21A of the core 21, for example an upper side of the core 21 in the local reference system of FIG. 2A. The first portion 22A of the first layer 22 is covered by a first portion 23A of the second layer 23 always placed at the first side 21A of the core 21. In the example of the figure, the first portion 22A of the first layer 22 is contacting the core 21, right at the first side 21A and the first portion 23A of the second layer 23 is contacting the first portion 22A of the first layer 22.

Similarly, the multilayer probe 20 includes a second portion 22B of the first layer 22 at a second side 21B of the core 21, for example a lower side of the core 21 in the local reference system of FIG. 2A. The second portion 22B of the first layer 22 is covered by a second portion 23B of the second layer 23 always placed at the second side 21B of the core 21. In the example of the figure, the second portion 22B of the first layer 22 is contacting the core 21, right at the second side 21B and the second portion 23B of the second layer 23 is contacting the second portion 22B of the first layer 22.

According to an alternative embodiment shown in FIG. 2B, the multilayer probe also includes respective adhesive films 24A, 24B being arranged between the core 21 and the portions 22A and 22B of the first layer 22 in order to facilitate the adhesion of the first layer 22 on the core 21.

In both the embodiments, the multilayer probes 20 have respective edge portions 25A and 25B at the profile of those multilayer probes 20, where the core 21 is exposed to the environment. At those edge portions 25A and 25B also the first layer 22 is exposed, particularly its portions 22A and 22B, and possibly also the adhesive films 24A, 24B, those layer being made of materials that do not offer enough hardness and/or corrosion strength.

Therefore, the exposed areas of the core 21, of the first layer 22, and possibly also the adhesive films 24A, 24B, lead to corrosion problems in the multilayer probes 20. Moreover, in case of vertical probe heads, if those elements are made of a relatively soft material, sliding problems of the multilayer probes 20 inside the guide holes of the upper and lower guides can arise.

BRIEF SUMMARY

An embodiment of the disclosure is directed to a contact probe able to guarantee a good electrical and mechanical contact with the contact pads of a device under test also in case of testing operations in moist or corrosive environments, avoiding at the same time problems of probes being damaged or stuck in the vertical probe configurations, in particular of probes realized by means of laser cutting of a multilayer metal sheet, so as to overcome the limitations and drawbacks currently affecting the testing heads according to the prior art.

More in particular, it is provided to completely cover the contact probes obtained from a multilayer with a metal material layer having high hardness and corrosion strength.

According to an aspect of the disclosure, a contact probe for a testing head of an apparatus for testing electronic devices includes a body essentially extended according to a longitudinal direction between a contact tip and a contact head, the contact probe comprising at least one multilayer structure, in turn including a superposition of at least one inner layer or core and a first inner coating layer, and an outer coating layer that completely covers the multilayer structure and made of a material having a higher hardness than a material realizing the core, that outer coating layer also covering edge portions comprising the core and the first inner coating layer.

According to another aspect of the disclosure, the first inner coating layer can include a first portion and a second portion arranged at a first side and at a second opposite side of the core, respectively.

According to yet another aspect of the disclosure, the core can be made of a first conductive material and the first inner coating layer is made of a second conductive material having values of electrical and thermal conductivity higher than the first conductive material.

Further, the core can be made of a non-conductive material and the first inner coating layer can be made of a second conductive material having a high electrical and thermal conductivity.

According to another aspect of the disclosure, the multilayer structure can further include a second inner coating layer that covers the first inner coating layer. In particular, the second inner coating layer can include a first portion and a second portion that cover the first portion and second portion of the first inner coating layer at the first side and at the second opposite sides of the core, respectively.

According to yet another aspect of the disclosure, the multilayer structure can further comprise an adhesive film, disposed between the core and the first inner coating layer and made of a material adapted to facilitate the adhesion of the first inner coating layer on the core.

Furthermore, the contact probe can further include a protective layer completely surrounding the multilayer structure and being interposed between the multilayer structure and the outer coating layer.

According to another aspect of the disclosure, the multilayer structure can also include a plurality of first inner coating layers and second inner coating layers being arranged one above the other in an alternated manner and in any number starting from the core.

In particular, the multilayer structure can further include one or more adhesive films arranged between the core and a first inner coating layer, as well as between a second inner coating layer and a further first inner coating layer.

According to another aspect of the disclosure, the core can be made of a first material being selected among nickel, tungsten, cobalt, palladium or alloys thereof, such as nickel-manganese, nickel-cobalt, nickel-palladium or nickel-tungsten alloys, preferably nickel-tungsten or of a non-conductive material, preferably silicon.

Furthermore, the first inner coating layer can be made of a second conductive material, particularly a metal material being selected among copper, silver, gold or alloys thereof, preferably copper.

Particularly, the second inner coating layer can be made of that second conductive material.

According to another aspect of the disclosure, the outer coating layer can be made of a third conductive material being selected among rhodium, platinum, iridium or a metal alloy thereof or a palladium-cobalt alloy, a palladium-nickel alloy or a nickel-phosphorus alloy, preferably rhodium.

Moreover, the adhesive film can be made of a metal or a metal alloy being selected among gold, silver, platinum or a metal alloy thereof, preferably gold.

Furthermore, the protective layer can be made of a metal or a metal alloy being selected among rhodium, gold, platinum, palladium or a metal alloy thereof or a palladium-cobalt alloy, preferably palladium.

The technical problem is also solved by a testing head of an apparatus for testing electronic devices characterized in that it comprises a plurality of contact probes made as described above.

In particular, the testing head can include a ceramic plate-shaped support to which the plurality of contact probes is fixedly fastened at the respective contact heads.

Alternatively, the testing head can include at least one pair of guides provided with respective guide holes where the contact probes slide.

The characteristics and advantages of the contact probe and the testing head according to the disclosure will be evident from the following description of embodiments thereof, given by way of an indicative and non-limiting example with reference to the annexed drawings.

DETAILED DESCRIPTION

Figure 1:
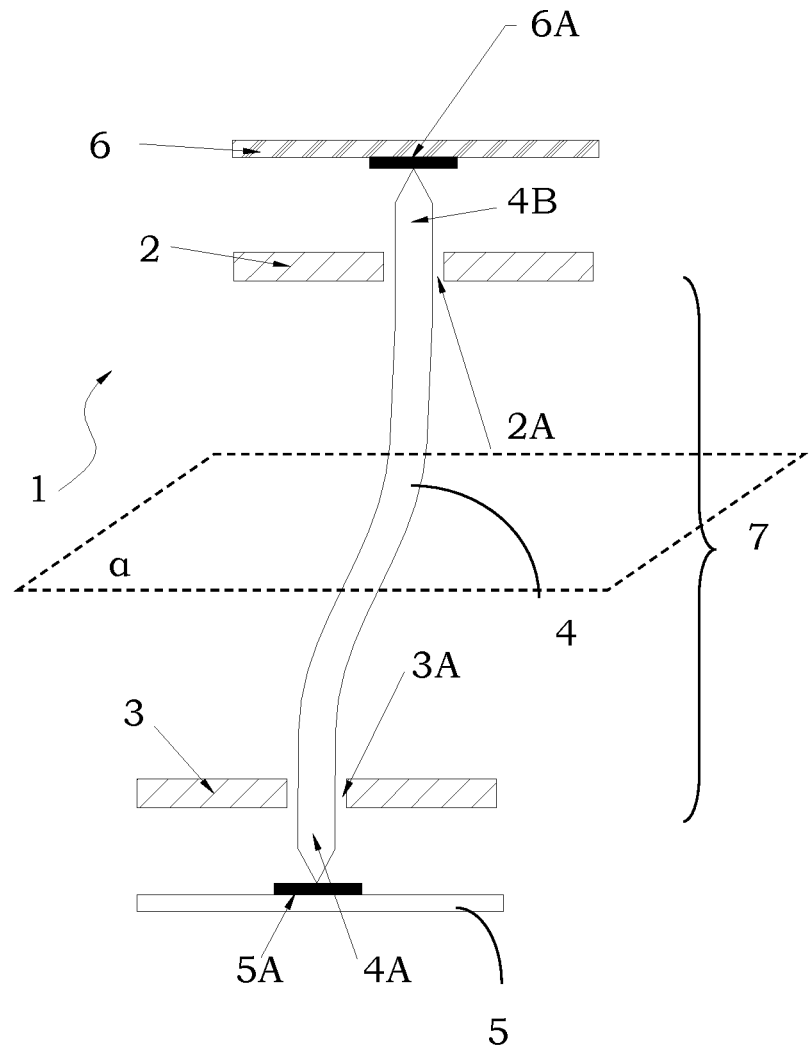
FIG. 1 schematically shows a contact probe of a vertical probe head according the prior art.
Figure 2A:
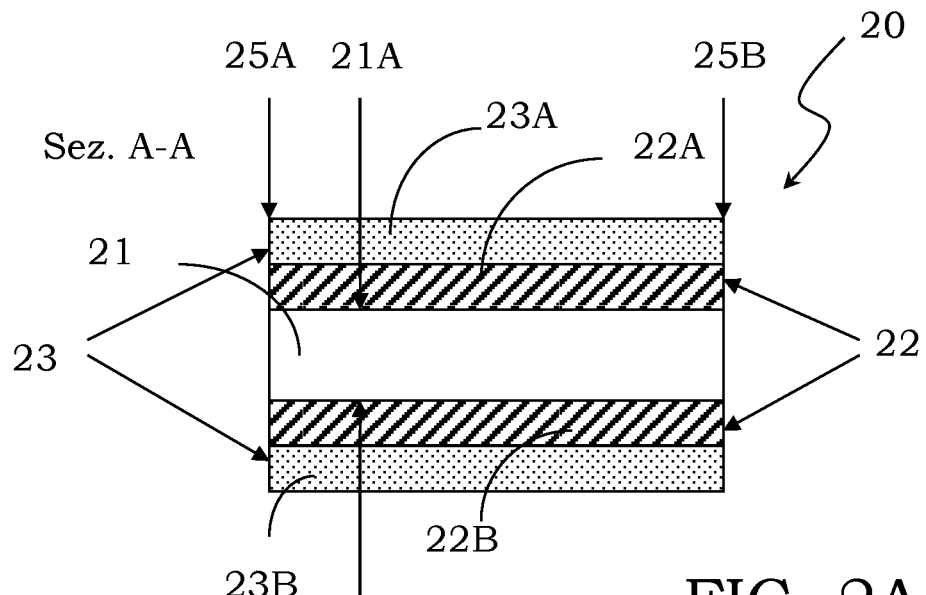
FIGS. 2A and 2B schematically show a cross section of respective alternative embodiments of contact probes according to the prior art.
Figure 2B:
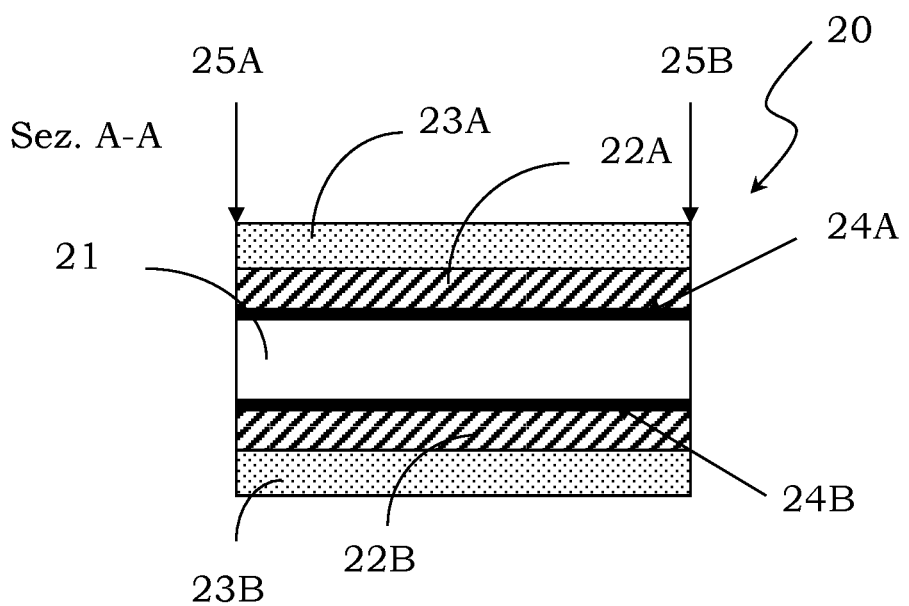
Figure 3:
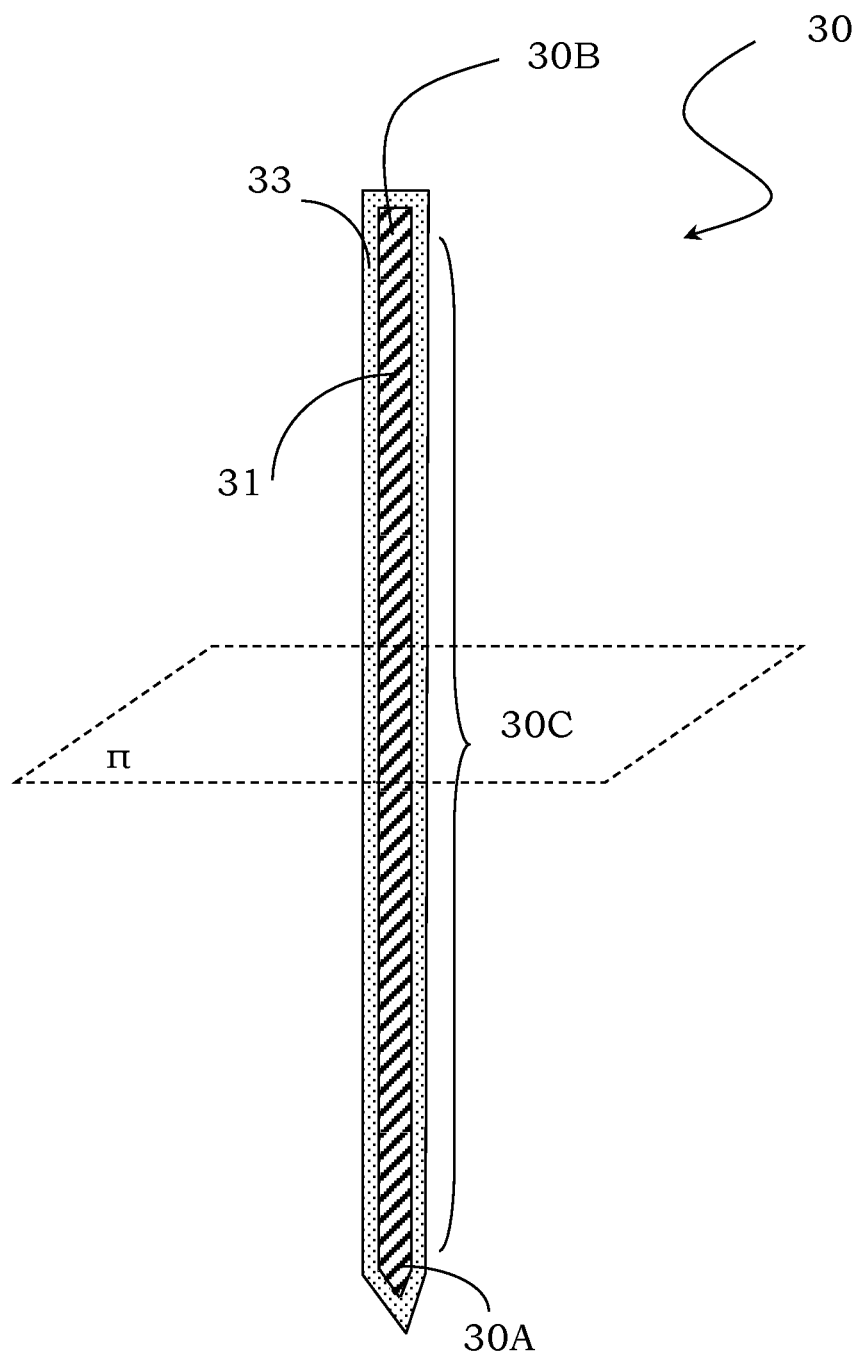
FIG. 3 schematically shows a contact probe according to an embodiment of the disclosure.

With reference to those figures and particularly to FIG. 3, a contact probe for a testing head of an apparatus for testing electronic devices integrated on a wafer is described and globally indicated with 30.

It should be noted that the figures represent schematic views of the contact probe according to the disclosure and they are not drawn at scale, being drawn instead so as to underline the important characteristics of the disclosure. In the figures, the different parts are shown schematically, their shape being able to vary according to the desired application.

The contact probe 30 includes at least one contact tip 30A apt to abut on a contact pad of a device under test, not shown as it is conventional.

The contact probe 30 can also include, as shown in the example of FIG. 3, a contact head 30B, having same or different shape with respect to the contact tip 30A. That contact head 30B can be intended to abut on a contact pad of a space transformer, as in the case of non-blocked probes, or can be fixedly associated, for example soldered, to a ceramic support, as in the case of the probes protruding from that support.

The contact probe 30 also comprises a body 30C essentially extended according to a longitudinal direction between the contact tip 30A and the contact head 30B.

According to an aspect of the disclosure, the contact probe 30 comprises a multilayer structure 31, in turn including at least one inner layer 32 or core made of a first material, in particular nickel-tungsten NiW, coated at two opposite sides thereof by a first inner coating layer 33, in particular a high conductivity layer, for example made of gold Au, as schematically shown in FIGS. 4A-4E, which represent sections P-P being taken at a plane n shown in FIG. 3.

More particularly, in the example shown in FIGS. 4A-4E, the first inner coating layer 33 includes a first portion 33A arranged at a first side 32A of the core 32, for example an upper side in the local reference system of FIGS. 4A-4E, as well as a second portion 33B at a second side 32B of the core 32, for example a lower side.

Therefore, the multilayer structure 31 has at least one first edge portion 34A and a second edge portion 34B where the core 32 and also the first inner coating layer 33 are exposed. It is clear to one skilled in the art that those edge portions 34A, 34B can result, for example, from a laser cut of the contact probe 30 starting from a multilayer sheet.

Advantageously according to the disclosure, the contact probe 30 also includes an outer coating layer 35, in particular a high hardness layer, for example made of rhodium Rd, which completely covers the contact probe 30 itself and thus covers the exposed portions of the core 32 and of the first inner coating layer 33.

Figure 4A:
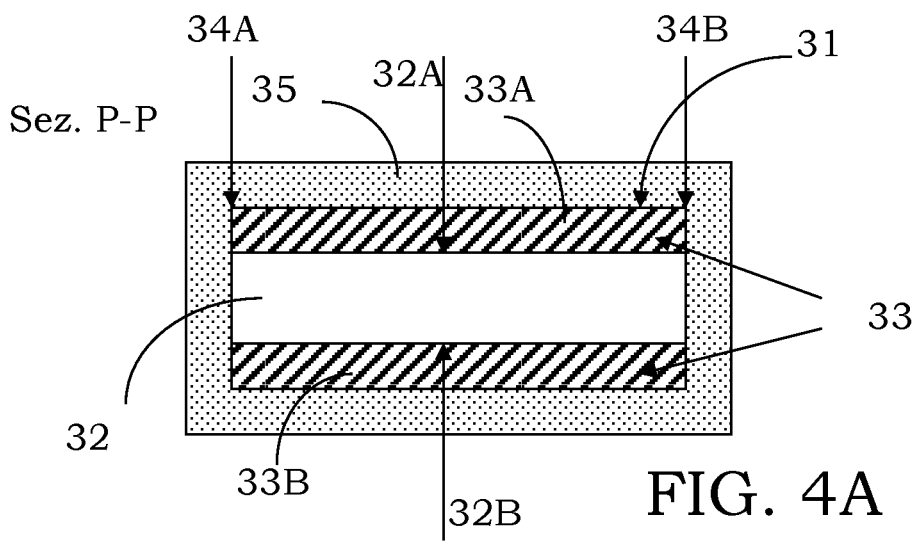
FIGS. 4A-4E schematically show an enlarged cross section of a contact probe according to different embodiments of the disclosure.
Figure 4B:
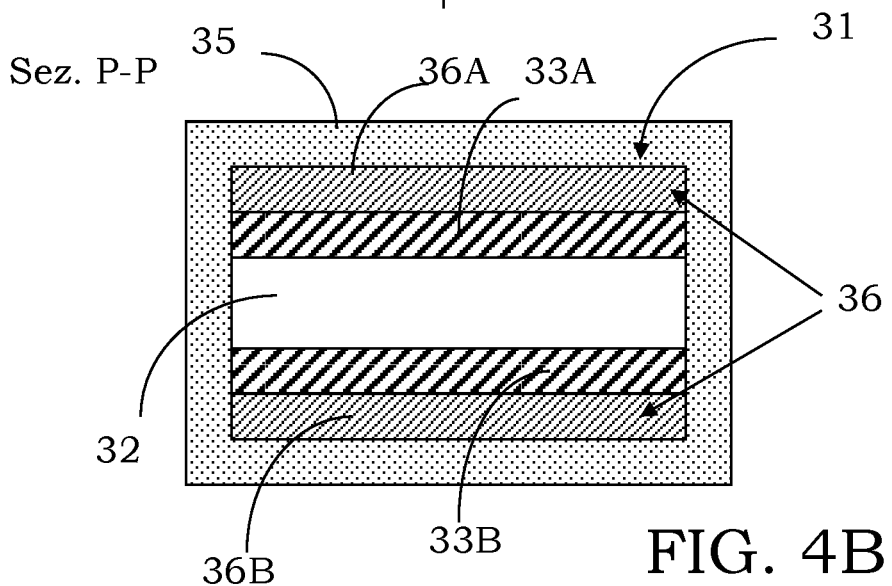

In an alternative embodiment shown in FIG. 4B, the multilayer structure 31 of the contact probe 30 can include a second inner coating layer 36 that covers the first inner coating layer 33. In particular, the first portion 33A of the first inner coating layer 33 is covered by a first portion 36A of the second inner coating layer 36 always arranged at the first side 32A of the core 32.

In the example of the figure, the first portion 33A of the first inner coating layer 33 is contacting the core 32, right at the first side 32A, and the first portion 36A of the second inner coating layer 36 is contacting the first portion 33A of the first inner coating layer 33.

Similarly, the second portion 33B of the first inner coating layer 33 is covered by a second portion 36B of the second inner coating layer 36 always arranged at the second side 32B of the core 32.

Figure 4C:
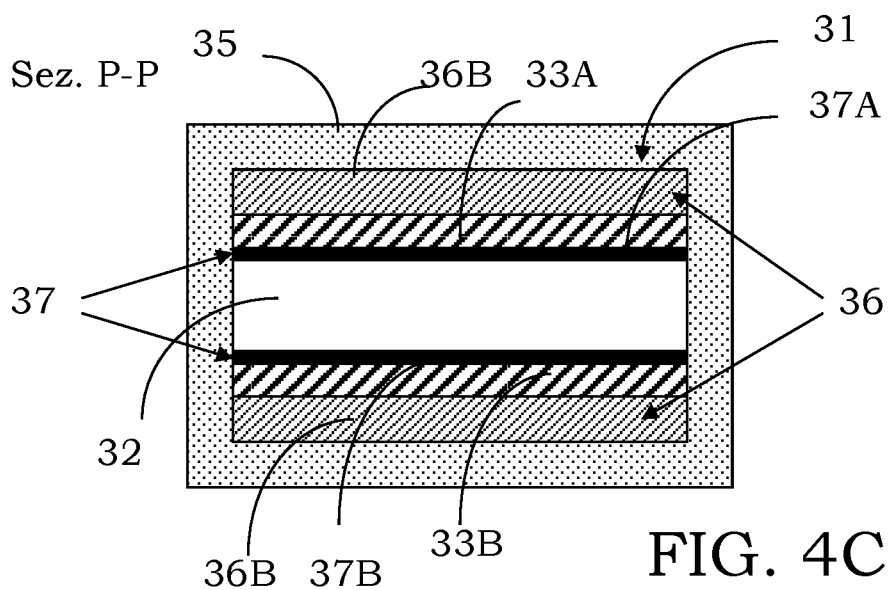

Further, as shown in FIG. 4C, the multilayer structure 31 also includes an adhesive film 37, disposed between the core 32 and the first inner coating layer 33 and made of a material apt to facilitate the adhesion of the first inner coating layer 33 on the core 32. In particular, the adhesive film 37 includes a first portion 37A arranged between the core 32 and the first portion 33A of the first inner coating layer 33 and a second portion 37B arranged between the core 32 and the second portion 33B of the first inner coating layer 33.

Figure 4D:
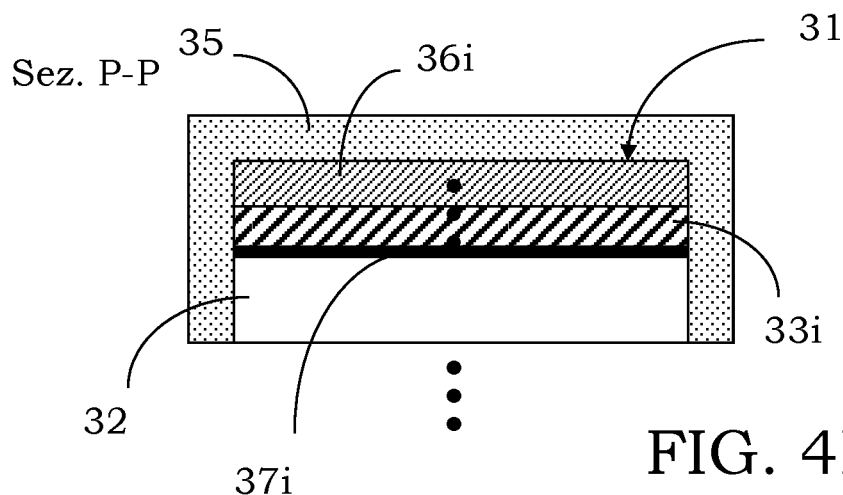

According to a further alternative embodiment, schematically shown in FIG. 4D, the multilayer structure 31 can include a plurality of first inner coating layers 33$i$ and second inner coating layers 36$i$ arranged in an alternated manner and in any number at the first and second side 32A, 32B of the core 32. According to that alternative embodiment too, the multilayer structure 31 can include one or more adhesive films 37$i$ arranged between the core 32 and a first inner coating layer 33, as well as between a second inner coating layer 36 and a further first inner coating layer 33.

Figure 4E:
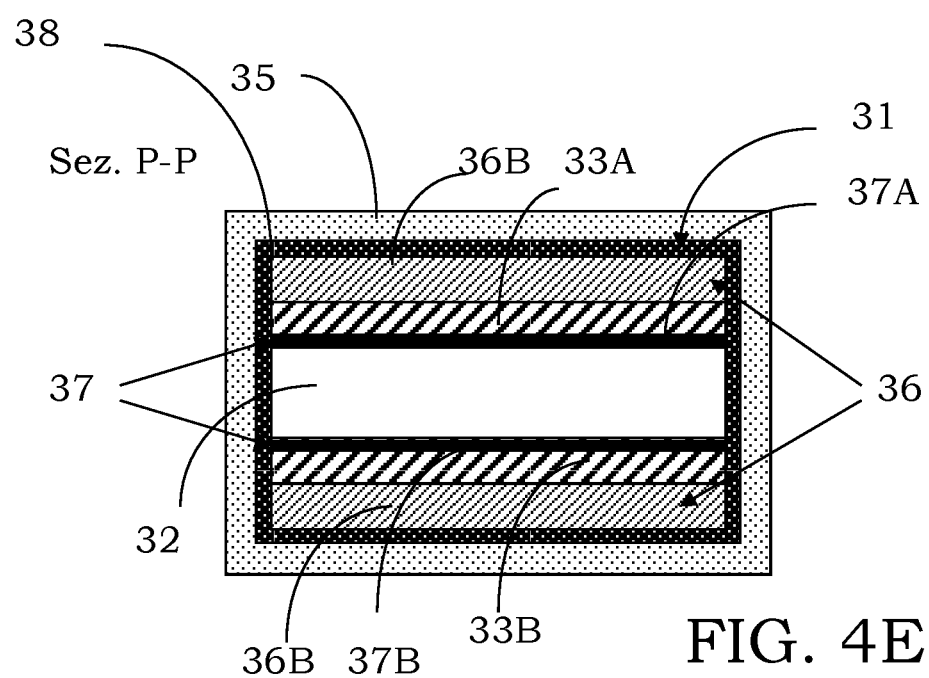

According to another alternative embodiment, schematically shown in FIG. 4E, the contact probe 30 also includes a protective layer 38, which completely surrounds the multilayer structure 31, and is interposed between the multilayer structure 31 and the outer coating layer 35.

Typical dimensional ranges for the different elements of the contact probe 30 according to the disclosure are the following:
- a core 32 having section from 10×10 to 50×50 μm;
- a high conductivity first inner coating layer 33 having thickness from 0.5 to 20 μm;
- a second inner coating layer 36 having thickness from 0.5 to 20 μm; and
- an outer coating layer 35 having thickness from 0.01 to 5 μm.

Typical length values of a contact probe range from 2 to 9 mm.

In the realization example shown in figures, the contact probe 30 has a substantially rectangular section. Obviously, the same could have a section having any prismatic shape.

The core 32 is made of a first conductive material, in particular a metal or a metal alloy, such as nickel or an alloy thereof, such as the nickel-manganese NiMn, nickel-cobalt NiCo or nickel-tungsten NiW alloys. In a preferred embodiment of the disclosure, the core 32 is made of nickel-tungsten NiW. Alternatively, the core 32 can also be made of a non-conductive material, for example silicon Si.

Further, the first inner coating layer 33 is made of a second conductive material, in particular a metal material having high electrical and thermal conductivity values, in particular greater than the values of the first conductive material. Therefore, that metal material is selected among copper Cu, silver Ag, gold Au or alloys thereof. In a preferred embodiment of the disclosure, the first inner coating layer 33 is made of copper Cu.

The second inner coating layer 36 can be made of the same second conductive material, the alternation between the first inner coating layer 33 and the second inner coating layer 36 allowing making a more homogeneous multilayer structure 31 thanks to the use of individually thinner layers.

It should be underlined that the presence of the first inner coating layer 33 having high conductivity, i.e. low resistivity, modifies the electrical behavior of the contact probe 30.

In fact, the presence of that high conductivity layer, for example made of copper, essentially realizes a resistance in parallel to the resistance of the core 32 of the multilayer structure 31 of the contact probe 30.

In particular, under continuous current (DC) conditions, the current flows along the whole section of the contact probe 30, namely in the core 32, for example made of nickel-tungsten, and in the first inner coating layer 33 having high conductivity, for example made of copper. The resistance introduced by the first inner coating layer 33, having high conductivity and being made of copper, with respect to the resistance of the core 32, being made of nickel-tungsten, lowers the overall resistance of the multilayer structure 31 and thus of the contact probe 30, improving its current conduction.

Actually, it is as the contact probe 30 is made of a material having a conductivity being the average value between the conductivity of the first inner coating layer 33 having high conductivity and the one of the core 32, for example between copper and nickel-tungsten. A current applied to the contact probe 30, in any case, will prefer the less resistance path and will flow mainly in the first inner coating layer 33 having high conductivity.

Suitably, the behavior of the contact probe 30 is further improved under alternating current conditions. In fact in that case, according to the phenomenon known as "skin effect", the current flowing across the multilayer structure 31 of the contact probe 30 tends to flow substantially only in its external part, namely at the first inner coating layer 33 that is the one having the highest conductivity.

It should be remembered that skin effect indicates the phenomenon in which an alternating electrical current tends to be distributed inside a conductor in a non-uniform manner: the current density is higher on the conductor surface and lower inside the same.

From a theoretical point of view, the current density, i.e. the current per unit area of a conductor, decreases exponentially penetrating progressively from the outer surface towards its inner part. This is true for circular section or other shape conductors, as in the case of the contact probes of a testing head.

Substantially, thanks to the multilayer structure 31, the contact probe 30 is able to sustain higher current densities than a traditional probe entirely made of nickel-tungsten, since most of the current applied thereto flows into its first inner coating layer 33 having high conductivity, i.e. lower resistivity. The contact probe 30 is able to sustain yet higher current densities in case of alternating currents which, due to the skin effect, tend to flow only in that first inner coating layer 33 having high conductivity.

Such a contact probe 30 also has lower leakages during the test signals transmission. Finally, the presence of the first inner coating layer 33 having high conductivity guarantees a better heat dissipation by the multilayer structure 31 of the contact probe 30.

Moreover, the outer coating layer 35 is made of a third conductive material having higher hardness with respect to the one of the first conductive material making the core 32 of the multilayer structure 31. Preferably, the third conductive material is a metal or a metal alloy, in particular rhodium Rd, platinum Pt, iridium Ir or a metal alloy thereof or a palladium-cobalt PdCo alloy, a palladium-nickel PdNi alloy or a nickel-phosphor NiPh alloy. In a preferred embodiment of the disclosure, the outer coating layer 35 is made of rhodium Rd.

It should be underlined that the third conductive material is selected in order to have a good electrical conductivity and thus in order not to significantly worsen the values measured by the contact probe. Moreover, it should be underlined that the presence of the outer coating layer 35 allows providing the contact probe 30 with a higher external hardness and improving its sliding through the guide holes realized in the plate-shaped guides of the testing head including it, protecting the exposed portions of the layers of the multilayer structure 31. In that way, when the probe is slidingly assembled in guide holes realized in plate-shaped guides, in particular ceramic ones, abrasions or "peelings" of the probe itself do not occur during the operation.

Substantially, the outer coating layer 35 made of rhodium generally improves the mechanical performance of the probe.

Further, the outer coating layer 35 made of rhodium, which completely covers the contact probe 30, including its contact tip 30A, allows incrementing the probe working life, guaranteeing its proper operation for a high number of testing operations where that tip 30A is in pressing contact on the contact pads of a device under test and also during many tip cleaning and re-shape operations which usually involve abrasive cloths.

As a consequence, advantageously according to the present disclosure, the presence of the outer coating layer 35 prevents the damage and the oxidation of the core 32 and of the first inner coating layer 33, in particular at the exposed edge portions 34A and 34B, which edge portions are covered by the outer coating layer 35.

Moreover, the adhesive film 37 can be made of a metal or a metal alloy, in particular gold Au, silver Ag, platinum Pt or a metal alloy thereof, preferably gold Au, in order to improve the adhesion of the first inner coating layer 33, having high conductivity, on the core 32.

By the term "film" it is meant, as it is known in this technical field, a layer having a thickness between 0.01 and 0.5 μm.

Finally, the protective layer 38 is made of a metal or a metal alloy, in particular rhodium Rd, gold Au, platinum Pt, palladium Pd or a metallic alloy thereof or a palladium-cobalt PdCo alloy, preferably palladium Pd, and it is adapted to protect the multilayer structure 31 from corrosive agents able to penetrate in the outer coating layer 35.

It is in fact well known that, by using rhodium to make the outer coating layer 35, the same is quite porous and allows the oxygen passage which could oxidize the first inner coating layer 33 having high conductivity, for example made of copper, of the multilayer structure 31. That oxidation can be prevented by using a protective layer 38, for example made of palladium, interposed between the multilayer structure 31, and thus the first inner coating layer 33, and the outer coating layer 35. In fact, a protective layer 38 made of palladium is not permeable to the oxygen, which oxygen thus cannot reach the first inner coating layer 33 having high conductivity and thus cannot damage it.

A testing head comprises a plurality of probes made according to the contact probe 30 of the present disclosure. In particular, such a testing head could include an upper guide and a lower guide in a spaced apart relation from each other in order to define an air gap and provided with respective upper and lower guide holes inside which that plurality of contact probes slide.

Alternatively, the testing head could include a plate-shaped support, in particular a ceramic one, to which the plurality of contact probes is fixedly fastened at the probe heads, while the probe tips freely protrude starting from the plate-shaped support in order to abut on a corresponding plurality of contact pads of a device under test.

It should be underlined that the contact probe according to the disclosure can be made staring from a multilayer sheet, by means of laser cutting thereof. Alternatively, it is possible to use a photolithographic technology, namely by means of a so-called MEMS Process.

Thanks to the improved contact probe performances, such as the improved current capability due to the high conductivity layer and the hardness of the outer coating layer, it is possible to reduce the cross-section and consequently also the length of the probe, for example up to halving it compared to known probes used for similar applications. It is immediately clear that the probe length reduction, the performances being equal, allows reducing the RLC parasitic effects and in particular the inductance value, with an advantage on the performances of the overall contact probe, in particular the frequency performances.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A contact probe for a testing head of an apparatus for testing electronic devices, comprising:
    a body extended along a longitudinal direction between a contact tip and a contact head, wherein the body includes:
    at least one multilayer structure having opposing first and second planar surfaces and opposing first and second lateral side surfaces extending between the first and second planar surfaces, the multilayer structure including a superposition of at least one inner layer or core and a plurality of first inner coating layers that are planar and parallel to each other, wherein the core includes lateral edge portions at the first and second lateral side surfaces of the multilayer structure, and each of the first inner coating layers includes lateral edge portions at the first and second lateral side surfaces of the multilayer structure, and
    an outer coating layer that completely covers the multilayer structure including the lateral edge portions of the core, wherein:
        the outer coating layer is on the first and second planar surfaces of the multilayer structure, the lateral edge portions of the core, and the lateral edge portions of the first inner coating layers, and
        the outer coating layer is made of a material having a higher hardness than a material realizing the core, and
    wherein the multilayer structure comprises:
        the plurality of first inner coating layers and a plurality of second inner coating layers arranged one above the other in an alternated manner starting from the core,
        one or more adhesive films arranged between the core and a first one of the first inner coating layers, and
        one or more adhesive films arranged between one of the second inner coating layers and a second one of the first inner coating layers,
        wherein each of the adhesive films extends between the first and second lateral side surfaces of the multilayer structure and does not cover the lateral edge portions of the core, lateral portions of the first inner coating layers, or lateral edge portions of the second inner coating layers.

2. The contact probe of claim 1, wherein the lateral edge portions of the first inner coating layers of the multilayer structure are covered by the outer coating layer.

3. The contact probe of claim 1, wherein at least one of the first inner coating layers comprises a first portion and a second portion arranged at a first side and at a second, opposite side of the core, respectively.

4. The contact probe of claim 1, wherein the core is made of a first conductive material and the first inner coating layers are made of a second conductive material having values of electrical and thermal conductivity higher than the first conductive material.

5. The contact probe of claim 1, wherein the core is made of a non-conductive material and the first inner coating layers are made of a conductive material having a high electrical and thermal conductivity.

6. The contact probe of claim 1, wherein each of the second inner coating layers covers a respective one of the first inner coating layers.

7. The contact probe of claim 1, wherein the one or more adhesive films arranged between the core and the first one of the first inner coating layers is made of a material adapted to facilitate adhesion of the first one of the first inner coating layers on the core, wherein the adhesive film extends between the first and second lateral side surfaces of the multilayer structure and does not cover the lateral edge portions of the core or the lateral edge portions of the first one of the first inner coating layers.

8. The contact probe of claim 1, wherein the second inner coating layers are made of a conductive material.

9. The contact probe of claim 1, wherein the outer coating layer is made of a conductive material being selected among rhodium, platinum, iridium or a metal alloy thereof or a palladium-cobalt alloy, a palladium-nickel alloy or a nickel-phosphorus alloy.

10. A testing head of an apparatus for testing electronic devices, comprising:
a plurality of contact probes, wherein each contact probe includes:
a body extended along a longitudinal direction between a contact tip and a contact head, wherein the body includes:
at least one multilayer structure having opposing first and second planar surfaces and opposing first and second lateral side surfaces extending between the first and second planar surfaces, the multilayer structure including a superposition of at least one inner layer or core and a first inner coating layer that are planar and parallel to each other, the core including lateral edge portions at the first and second lateral side surfaces of the multilayer structure that are not covered by the first inner coating layer,
an outer coating layer that completely covers the first and second planar surfaces of the multilayer structure, the outer coating layer being made of a material having a higher hardness than a material realizing the core, and
a protective layer completely surrounding the multilayer structure and interposed between the multilayer structure and the outer coating layer, of the contact probe, the outer coating layer covering the protective layer.

11. The testing head of claim 10, wherein the first inner coating layer of the multilayer structure of each contact probe includes edge portions covered by the outer coating layer of the contact probe.

12. The testing head of claim 10, wherein the first inner coating layer of each contact probe comprises a first portion and a second portion arranged at a first side and at a second, opposite side of the core of the probe, respectively.

13. The testing head of claim 10, wherein the core of each contact probe is made of a first conductive material and the first inner coating layer is made of a second conductive material having values of electrical and thermal conductivity higher than the first conductive material.

14. The testing head of claim 10, wherein, for each contact probe, the core is made of a non-conductive material and the first inner coating layer is made of a conductive material having a high electrical and thermal conductivity.

15. The testing head of claim 10, wherein the multilayer structure of each contact probe further comprises a second inner coating layer that covers the first inner coating layer of the contact probe.

16. The testing head of claim 15, wherein the second inner coating layer of the contact probes is made of a conductive material.

17. The testing head of claim 10, wherein, for each contact probe, the multilayer structure further comprises an adhesive film, disposed between the core and the first inner coating layer and made of a material adapted to facilitate the adhesion of the first inner coating layer on the core, wherein the adhesive film extends between the first and second lateral side surfaces of the multilayer structure and does not cover the lateral edge portions of the core or lateral edge portions of first inner coating layer.

18. The testing head of claim 10, wherein, for each contact probe, the multilayer structure comprises a plurality of first inner coating layers and second inner coating layers arranged one above the other in an alternated manner and in any number starting from the core of the contact probe.

19. The testing head of claim 18, wherein, in each contact probe, the multilayer structure further comprises one or more adhesive films arranged between the core and a first one of the first inner coating layers, and one or more adhesive films between one of the second inner coating layers and a second one of the first inner coating layers,
wherein each of the adhesive films extends between the first and second lateral side surfaces of the multilayer structure and does not cover the lateral edge portions of the core.

20. A contact probe for a testing head of an apparatus for testing electronic devices, comprising:
a body extended along a longitudinal direction between a contact tip and a contact head, wherein the body includes:
at least one multilayer structure having opposing first and second planar surfaces and opposing first and second lateral side surfaces extending between the first and second planar surfaces, the multilayer structure including a superposition of at least one inner layer or core and a first inner coating layer that are planar and parallel to each other,
an outer coating layer that completely covers the multilayer structure, wherein:
the outer coating layer is made of a material having a higher hardness than a material realizing the core and also covers lateral edge portions of the multilayer structure at the first and second lateral side surfaces,
the lateral edge portions include lateral edge portions of the core and lateral edge portions of the first inner coating layer, and
the outer coating layer is on the first and second planar surfaces of the multilayer structure, the lateral the edge portions of the core, and the lateral edge portions of the first inner coating layer, and
a protective layer completely surrounding the multilayer structure and interposed between the multi layer structure and the outer coating layer of the contact probe, the outer coating layer covering the protective layer.

21. The contact probe of claim 20, wherein the first inner coating layer comprises a first portion and a second portion arranged at a first side and at a second, opposite side of the core, respectively.

22. The contact probe of claim 20, wherein the core is made of a first conductive material and the first inner coating layer is made of a second conductive material having values of electrical and thermal conductivity higher than the first conductive material.

23. The contact probe of claim 20, wherein the core is made of a non-conductive material and the first inner coating layer is made of a conductive material having a high electrical and thermal conductivity.

24. The contact probe of claim 20, wherein the multilayer structure further comprises a second inner coating layer that covers the first inner coating layer.

25. The contact probe of claim 20, wherein the multilayer structure further comprises an adhesive film, disposed between the core and the first inner coating layer and made of a material adapted to facilitate the adhesion of the first inner coating layer on the core, wherein the adhesive film extends between the first and second lateral side surfaces of the multilayer structure and does not cover the lateral edge portions of the core or the lateral edge portions of first inner coating layer.

26. The contact probe of claim 25, wherein the second inner coating layer is made of a conductive material.

27. The contact probe of claim 20, wherein the multilayer structure comprises a plurality of first inner coating layers and second inner coating layers arranged one above the other in an alternated manner and in any number starting from the core.

28. The contact probe of claim 27, wherein the multilayer structure further comprises one or more adhesive films arranged between the core and a first one of the first inner coating layers, and one or more adhesive films arranged between a second inner coating layer and a second one of the first inner coating layers, wherein each of the adhesive films extends between the first and second lateral side surfaces of the multilayer structure and does not cover the lateral edge portions of the core, lateral edge portions of the first inner coating layers, or lateral edge portions of the second inner coating layers.

29. The contact probe of claim 20, wherein the outer coating layer is made of a conductive material selected among rhodium, platinum, iridium or a metal alloy thereof or a palladium-cobalt alloy, a palladium-nickel alloy or a nickel-phosphorus alloy.

\* \* \* \* \*

UNITED STATES PATENT AND TRADEMARK OFFICE
CERTIFICATE OF CORRECTION

PATENT NO. : 11,131,690 B2
APPLICATION NO. : 15/640097
DATED : September 28, 2021
INVENTOR(S) : Giuseppe Crippa Page 1 of 1

It is certified that error appears in the above-identified patent and that said Letters Patent is hereby corrected as shown below:

In the Claims

Column 11, Line 52, Claim 10:
"outer coating laver" should read: --outer coating layer--.

Signed and Sealed this
Twenty-first Day of February, 2023

Katherine Kelly Vidal
*Director of the United States Patent and Trademark Office*